United States Patent
Zhang et al.

(10) Patent No.: US 11,854,629 B2
(45) Date of Patent: Dec. 26, 2023

(54) SYSTEM AND METHOD FOR NON-PARAMETRIC OPTIMAL READ THRESHOLD ESTIMATION USING DEEP NEURAL NETWORK

(71) Applicant: SK hynix Inc., Gyeonggi-do (KR)

(72) Inventors: Fan Zhang, Fremont, CA (US); Aman Bhatia, Los Gatos, CA (US); Haobo Wang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 222 days.

(21) Appl. No.: 17/532,905

(22) Filed: Nov. 22, 2021

(65) Prior Publication Data

US 2023/0162803 A1    May 25, 2023

(51) Int. Cl.
*G11C 16/26* (2006.01)
*G11C 16/34* (2006.01)
*G11C 16/10* (2006.01)
*G06N 3/063* (2023.01)
*G11C 16/14* (2006.01)
*G06F 18/214* (2023.01)

(52) U.S. Cl.
CPC ........ *G11C 16/3404* (2013.01); *G06F 18/214* (2023.01); *G06N 3/063* (2013.01); *G11C 16/102* (2013.01); *G11C 16/14* (2013.01); *G11C 16/26* (2013.01)

(58) Field of Classification Search
CPC ... G11C 16/3404; G11C 16/102; G11C 16/14; G11C 16/26; G11C 2211/5632; G11C 16/0483; G11C 11/5642; G06F 18/214; G06N 3/063; G06N 3/048; G06N 3/045; G06N 3/08
See application file for complete search history.

(56) References Cited

U.S. PATENT DOCUMENTS

| | | |
|---|---|---|
| 8,116,141 B2 | 2/2012 | Yoo et al. |
| 8,369,141 B2 | 2/2013 | Sommer et al. |
| 8,605,502 B1 | 12/2013 | Desireddi et al. |
| 8,885,415 B2 | 11/2014 | Chilappagari et al. |
| 8,898,553 B1 | 11/2014 | Varnica et al. |
| 8,913,437 B2 | 12/2014 | Chilappagari et al. |

(Continued)

OTHER PUBLICATIONS

Office Action for the U.S. Appl. No. 17/443,755 issued by the USPTO dated Nov. 25, 2022.

(Continued)

*Primary Examiner* — Xiaochun L Chen
(74) *Attorney, Agent, or Firm* — IP & T GROUP LLP

(57) ABSTRACT

A scheme for non-parametric optimal read threshold estimation of a memory system. The memory system includes a memory device including pages and a controller including a neural network. The controller performs read operations on a selected page using a read threshold set; obtain the read threshold set, a checksum value and an asymmetric ratio of ones count and zeros count which are associated with decoding of the selected page according to each of the read operations; provide the obtained read threshold set, the checksum value and the asymmetric ratio as input information to the neural network; and estimate, by the neural network, an optimal read threshold voltage based on the input information and weights including a combination of multiple matrices and bias vectors.

18 Claims, 12 Drawing Sheets

(56) References Cited

U.S. PATENT DOCUMENTS

| | | |
|---|---|---|
| 8,990,665 B1 | 3/2015 | Steiner et al. |
| 9,069,659 B1 | 6/2015 | Sabbag et al. |
| 9,330,775 B2 | 5/2016 | Kim et al. |
| 9,542,258 B1 | 1/2017 | Lu et al. |
| 9,589,673 B1 | 3/2017 | Zhang et al. |
| 9,728,263 B2 | 8/2017 | Sharon et al. |
| 9,905,289 B1* | 2/2018 | Jeon .................. G11C 16/26 |
| 10,216,422 B2 | 2/2019 | Kim et al. |
| 10,236,067 B2 | 3/2019 | Fisher et al. |
| 10,276,247 B2 | 4/2019 | Alhussien et al. |
| 10,290,358 B2 | 5/2019 | Alhussien et al. |
| 10,573,389 B2 | 2/2020 | Kim et al. |
| 10,726,934 B2 | 7/2020 | Chew et al. |
| 10,877,827 B2 | 12/2020 | Miladinovic |
| 11,501,109 B2 | 11/2022 | Bazarsky et al. |
| 2010/0091535 A1 | 4/2010 | Sommer et al. |
| 2010/0149872 A1 | 6/2010 | Aoyagi |
| 2011/0228583 A1 | 9/2011 | Noguchi et al. |
| 2012/0236638 A1 | 9/2012 | Weingarten et al. |
| 2013/0176775 A1 | 7/2013 | Tang et al. |
| 2016/0103763 A1 | 4/2016 | Chen et al. |
| 2017/0076807 A1 | 3/2017 | Asami et al. |
| 2019/0004734 A1 | 1/2019 | Kirshenbaum et al. |
| 2019/0026076 A1 | 1/2019 | Leng et al. |
| 2019/0115078 A1 | 4/2019 | Kim et al. |
| 2019/0156180 A1 | 5/2019 | Nomura et al. |
| 2019/0172542 A1 | 6/2019 | Miladinovic |
| 2019/0279728 A1 | 9/2019 | Kodama et al. |
| 2019/0340062 A1 | 11/2019 | Cai et al. |
| 2019/0347573 A1 | 11/2019 | Shih |
| 2020/0066353 A1 | 2/2020 | Pletka et al. |
| 2020/0075118 A1 | 3/2020 | Chew et al. |
| 2020/0210096 A1 | 7/2020 | Kim et al. |
| 2020/0210831 A1 | 7/2020 | Zhang et al. |
| 2020/0234772 A1 | 7/2020 | Halperin et al. |
| 2020/0265903 A1 | 8/2020 | Kim et al. |
| 2020/0303016 A1 | 9/2020 | Amada |
| 2021/0082528 A1 | 3/2021 | Takizawa et al. |
| 2021/0264983 A1 | 8/2021 | Lemke et al. |
| 2021/0375364 A1 | 12/2021 | Liikanen et al. |
| 2022/0011969 A1 | 1/2022 | Zhang et al. |
| 2022/0068401 A1 | 3/2022 | Bhatia et al. |
| 2022/0238168 A1 | 7/2022 | Zhang et al. |
| 2022/0336039 A1 | 10/2022 | Zhang et al. |
| 2023/0027191 A1 | 1/2023 | Zhang et al. |
| 2023/0035983 A1 | 2/2023 | Wang et al. |
| 2023/0036490 A1 | 2/2023 | Wang et al. |

OTHER PUBLICATIONS

Office Action issued by the USPTO for U.S. Appl. No. 16/927,567 dated Jan. 5, 2022.

Notice of Allowance issued by the USPTO dated Mar. 8, 2022.

Non-final Office Action issued by United States Patent and Trademark Office for the U.S. Appl. No. 17/443,726 dated Oct. 11, 2022.

Wang, C., et al., DNN-aided Read-voltage Threshold Optimization for MLC Flash Memory with Finite Block Length, Apr. 11, 2020, p. 1-10, arXiv:2004.05340 [cs.IT].

Office Action for U.S. Appl. No. 16/927,567 issued by the USPTO dated Jun. 29, 2022.

* cited by examiner

SYSTEM AND METHOD FOR NON-PARAMETRIC OPTIMAL READ THRESHOLD ESTIMATION USING DEEP NEURAL NETWORK

BACKGROUND

1. Field

Embodiments of the present disclosure relate to a scheme for determining an optimal read threshold voltage in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may determine an optimal read threshold voltage among read threshold voltages according to various schemes.

SUMMARY

Aspects of the present invention include a system and a method for non-parametric optimal read threshold estimation using a deep neural network.

In one aspect of the present invention, a memory system includes a memory device including a plurality of pages and a controller including a neural network. The controller is configured to: perform one or more read operations on a page selected from among the plurality of pages using a read threshold set including a plurality of read threshold voltages; obtain the read threshold set, a checksum value and an asymmetric ratio of ones count and zeros count which are associated with decoding of the selected page according to each of the read operations; provide the obtained read threshold set, the checksum value and the asymmetric ratio as input information to the neural network; and estimate, by the neural network, an optimal read threshold voltage based on the input information and weights for the input information, the weights including a combination of multiple matrices and bias vectors.

In another aspect of the present invention, a method for operating a memory system, which includes a memory device including a plurality of pages and a controller including a neural network, includes: performing one or more read operations on a page selected from among the plurality of pages using a read threshold set including a plurality of read threshold voltages; obtaining the read threshold set, a checksum value and an asymmetric ratio of ones count and zeros count which are associated with decoding of the selected page according to each of the read operations; providing the obtained read threshold set, the checksum value and the asymmetric ratio as input information to the neural network; and estimating, by the neural network, an optimal read threshold voltage based on the input information and weights for the input information, the weights including a combination of multiple matrices and bias vectors.

Additional aspects of the present invention will become apparent from the following description.

DETAILED DESCRIPTION

Figure 1:
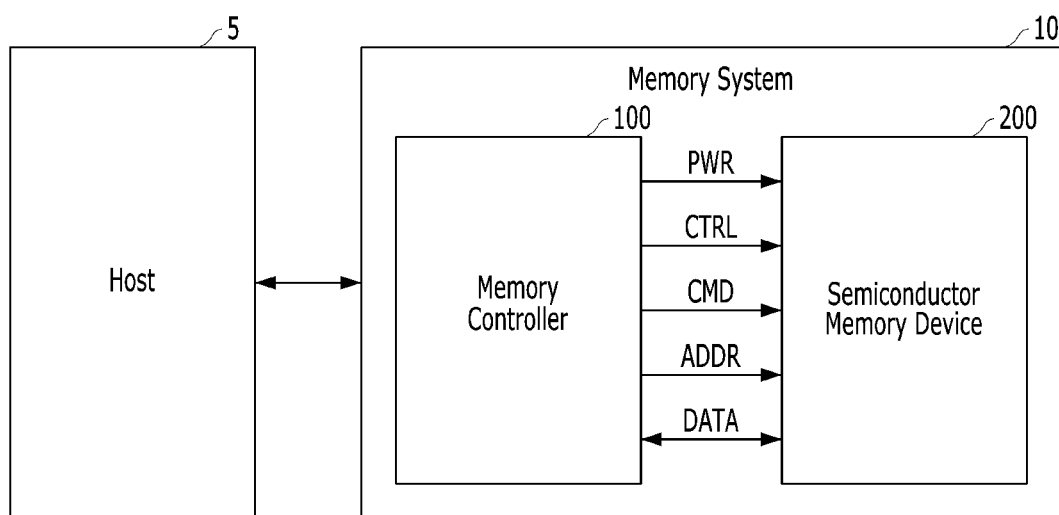
FIG. 1 is a block diagram illustrating a data processing system.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general device or circuit component that is configured or otherwise programmed to perform the task at a given time or as a specific device or as a circuit component that is manufactured or pre-configured or pre-programmed to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described herein, the code or instructions for implementing the operations of the method embodiments may transform the computer, processor, controller, or other signal processing device into a special-purpose processor for performing any one of the methods herein.

If implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of various embodiments of the present invention is provided below along with accompanying figures that illustrate aspects of the present invention. The present invention is described in connection with such embodiments, but the present invention is not limited to any specific embodiment. The present invention encompasses numerous alternatives, modifications and equivalents. Numerous specific details are set forth in the following description in order to provide a thorough understanding of the present invention. These details are provided for the purpose of example; the present invention may be practiced without some or all of these specific details. For clarity, technical material that is known in technical fields related to the present invention has not been described in detail so that the present invention is not unnecessarily obscured.

FIG. 1 is a block diagram illustrating a data processing system 2 in accordance with one embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may be an electronic device such as for example a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may be a portable electronic device such as for example a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as for example a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive through input/output lines a command CMD, an address ADDR and data DATA. The semiconductor memory device 200 may receive power PWR through a power line and a control signal CTRL through a control line. The control signal CTRL may include for example a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. In one embodiment of the invention, where the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
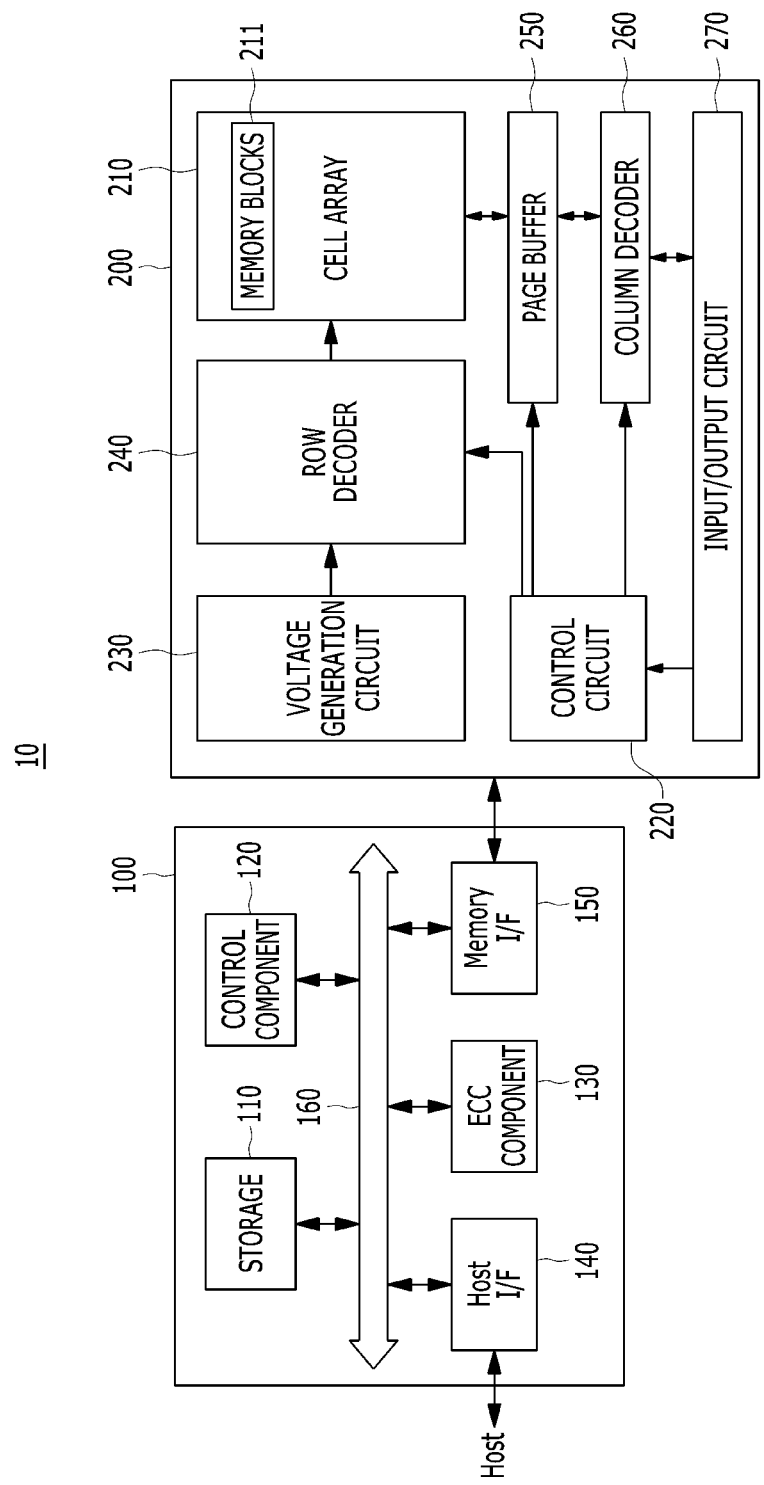
FIG. 2 is a block diagram illustrating a memory system.

FIG. 2 is a block diagram illustrating a memory system in accordance with one embodiment of the present invention.

For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., a request from host device 5 of FIG. 1), and in particular, store data to be accessed by the host device.

The memory device 200 may store data to be accessed by the host device.

The memory device 200 may be implemented with a volatile memory device such as for example a dynamic random access memory (DRAM) and/or a static random access memory (SRAM) or a non-volatile memory device such as for example a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as for example a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and storage 110 may store data for driving the memory system 10 and the controller 100. For example, when the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200 in response to a write request or a read request from the host device. The control component 120 may drive firmware or other program instructions, which can be referred to as a flash translation layer (FTL), to control operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during a read operation. In one embodiment, the ECC component 130 may not correct error bits when the number of the error bits is greater than or equal to a threshold number of correctable error bits, but instead may output an error correction fail signal indicating failure in correcting the error bits.

In various embodiments, the ECC component 130 may perform an error correction operation based on a coded modulation such as for example a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices suitable for error correction operation.

The host interface 140 may communicate with the host device through one or more of various communication standards or interfaces such as for example a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. In one embodiment where the memory device 200 is a flash memory such as a NAND flash memory, the memory interface 150 may generate control signals for the memory and process data under the control of the control component 120.

The memory device 200 as shown for example in FIG. 2 may include a memory cell array 210, a control circuit 220, a voltage generation circuit 230, a row decoder 240, a page buffer 250 which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform program, read, or erase operations of the memory cell array 210. The control circuit 220 may control the peripheral circuit.

The voltage generation circuit 230 may generate operational voltages of various levels. For example, in an erase operation, the voltage generation circuit 230 may generate operational voltages of various levels such as for example an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
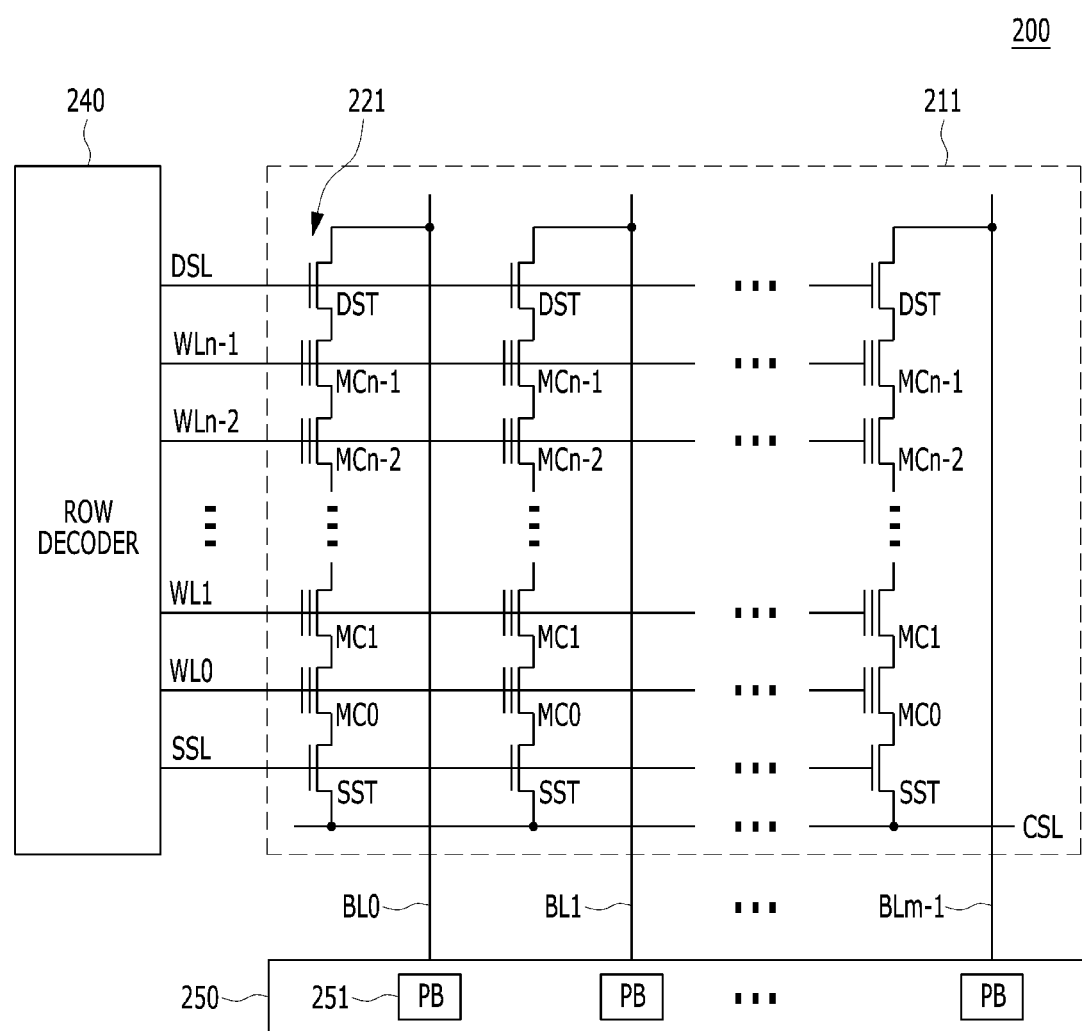
FIG. 3 is a circuit diagram illustrating a memory block of a memory device.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data in response to page buffer control signal(s) generated by the control circuit 220.

The column decoder 260 may transmit data to, and receive data from, the page buffer 250 or may transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn−1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 my temporarily store data received through the bit lines BL0 to BLm−1 or sense voltages or currents of the bit lines during a read or verify operation.

In various embodiments of the present invention, the memory blocks 211 may include a NAND-type flash memory cell. However, the memory blocks 211 are not limited to such cell type, and may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
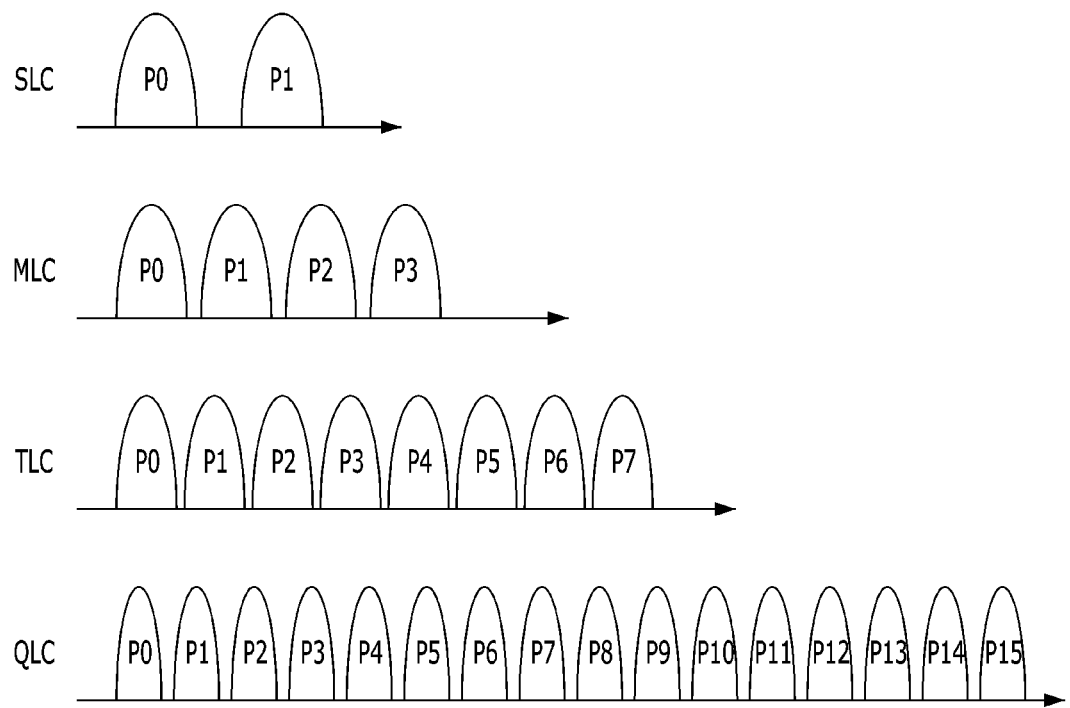
FIG. 4 is a diagram illustrating distributions of states for different types of cells of a memory device.

FIG. 4 is a diagram illustrating distributions of states or program voltage (PV) levels for different types of cells of a memory device.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed for example using a coding scheme (e.g., Gray coding) in order to increase the capacity of the memory system 10 such as SSD.

Figure 5A:
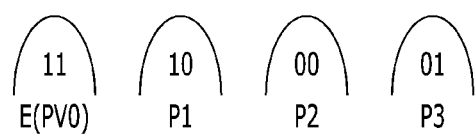
FIG. 5A is a diagram illustrating an example of Gray coding for a multi-level cell (MLC).

FIG. 5A is a diagram illustrating an example of coding for a multi-level cell (MLC).

Referring to FIG. 5A, an MLC may be programmed using a set type of coding. An MLC may have 4 program states, which include an erased state E (or PV0) and a first program state PV1 to a third program state PV3. The erased state E (or PV0) may correspond to "11." The first program state PV1 may correspond to "10." The second program state PV2 may correspond to "00." The third program state PV3 may correspond to "01."

Figure 5B:
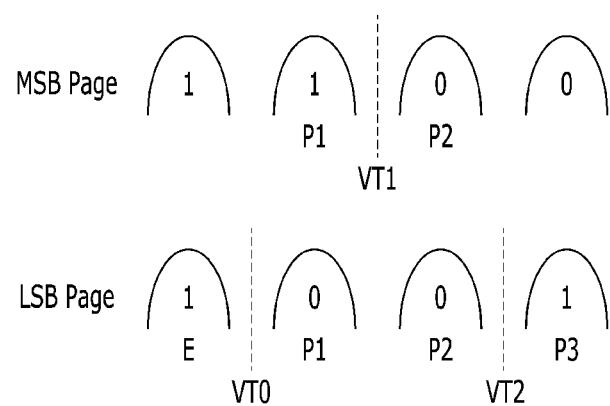
FIG. 5B is a diagram illustrating state distributions for pages of a multi-level cell (MLC).

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6A:
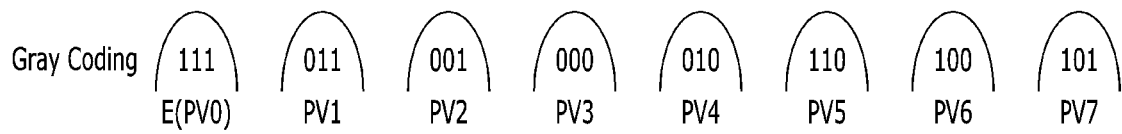
FIG. 6A is a diagram illustrating one example of Gray coding for a triple-level cell (TLC).

FIG. 6A is a diagram illustrating an example of Gray coding for a triple-level cell (TLC).

Referring to FIG. 6A, a TLC may be programmed using Gray coding. A TLC may have 8 program states, which include an erased state E (or PV0) and a first program state PV1 to a seventh program state PV7. The erased state E (or PV0) may correspond to "111." The first program state PV1 may correspond to "011." The second program state PV2 may correspond to "001." The third program state PV3 may correspond to "000." The fourth program state PV4 may correspond to "010." The fifth program state PV5 may correspond to "110." The sixth program state PV6 may correspond to "100." The seventh program state PV7 may correspond to "101."

Figure 6B:
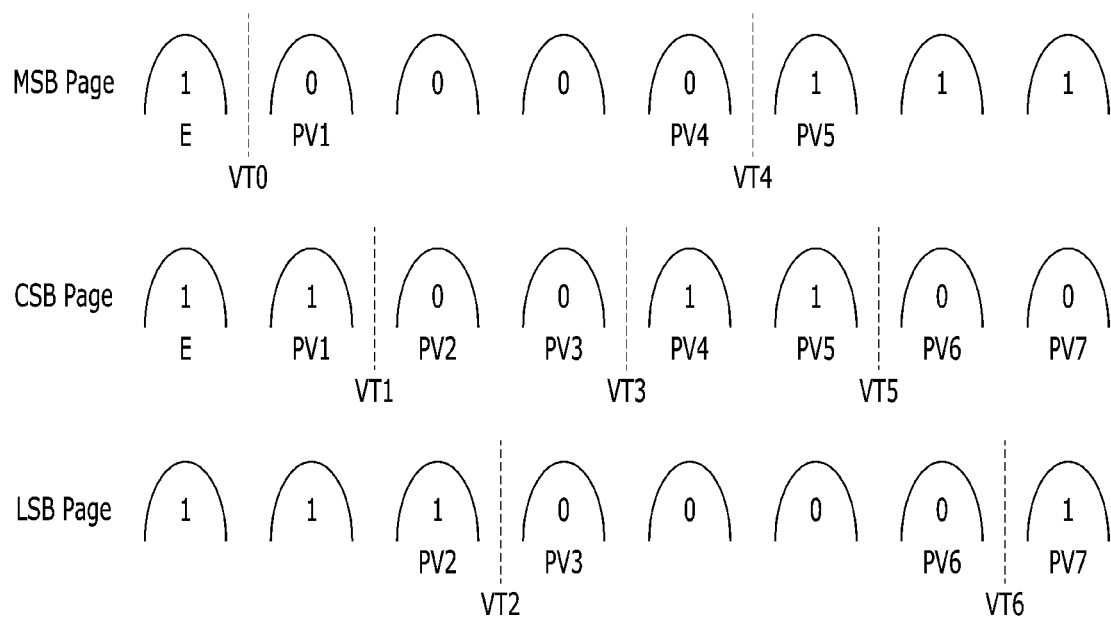
FIG. 6B is a diagram illustrating state distributions for pages of a triple-level cell (TLC).

In the TLC, as shown in FIG. 6B, there are 3 types of pages including LSB, CSB and MSB pages. 2 or 3 thresholds may be applied in order to retrieve data from the TLC. For an MSB page, 2 thresholds include a threshold value VT0 that distinguishes between an erase state E and a first program state PV1 and a threshold value VT4 that distinguishes between a fourth program state PV4 and a fifth program state PV5. For a CSB page, 3 thresholds include VT1, VT3 and VT5. VT1 distinguishes between a first program state PV1 and a second program state PV2. VT3 distinguishes between a third program state PV3 and the fourth program state PV4. VT5 distinguishes between the fourth program state PV5 and the sixth program state PV6. For an LSB page, 2 thresholds include VT2 and VT6. VT2 distinguishes between the second program state PV2 and the third program state PV3. VT6 distinguishes between the sixth program state PV6 and a seventh program state PV7.

After a memory array including a plurality of memory cells is programmed as described in FIGS. 5A and 6A, when a read operation is performed on the memory array using a reference voltage such as a read threshold voltage (also called "read voltage level" or "read threshold"), the electrical charge levels of the memory cells (e.g., threshold voltage levels of transistors of memory cells) are compared to one or more reference voltages to determine the state of individual memory cells. When a specific read threshold is applied to the memory array, those memory cells that have threshold voltage levels higher than the reference voltage are turned on and detected as "on" cell, whereas those memory cells that have threshold voltage levels lower than the reference voltage are turned off and detected as "off" cell, for example. Therefore, each read threshold is arranged between neighboring threshold voltage distribution windows corresponding to different programmed states so that each read threshold can distinguish such programmed states by turning on or off the memory cell transistors.

When a read operation is performed on memory cells in a data storage device using MLC technology, the threshold voltage levels of the memory cells are compared to more than one read threshold level to determine the state of individual memory cells. Read errors can be caused by distorted or overlapped threshold voltage distributions. An ideal memory cell threshold voltage distribution can be significantly distorted or overlapped due to, e.g., program and erase (P/E) cycles, cell-to-cell interference, and/or data retention errors. For example, as program/erase cycles increase, the margin between neighboring threshold voltage distributions of different programmed states decreases and eventually the distributions overlap. As a result, the memory cells with threshold voltages that fall within the overlapping region of the neighboring distributions may be read as being programmed to a value other than the original targeted value and thus cause read errors. Such read errors may be managed in many situations by using error correction codes (ECC). When the number of bit errors on a read operation exceeds the ECC correction capability of the data storage, the read operation using a set read threshold voltage fails. The set read threshold voltage may be a previously used read threshold voltage (i.e., a historical read threshold voltage). The historical read threshold voltage may be the read threshold voltage used in the last successful decoding, that is, a read voltage used in a read-passed read operation performed before read retry operations. When the read operation using the set read threshold voltage failed, the controller 120 may control an error recovery algorithm such as for example the algorithm shown in FIG. 7.

Figure 7:
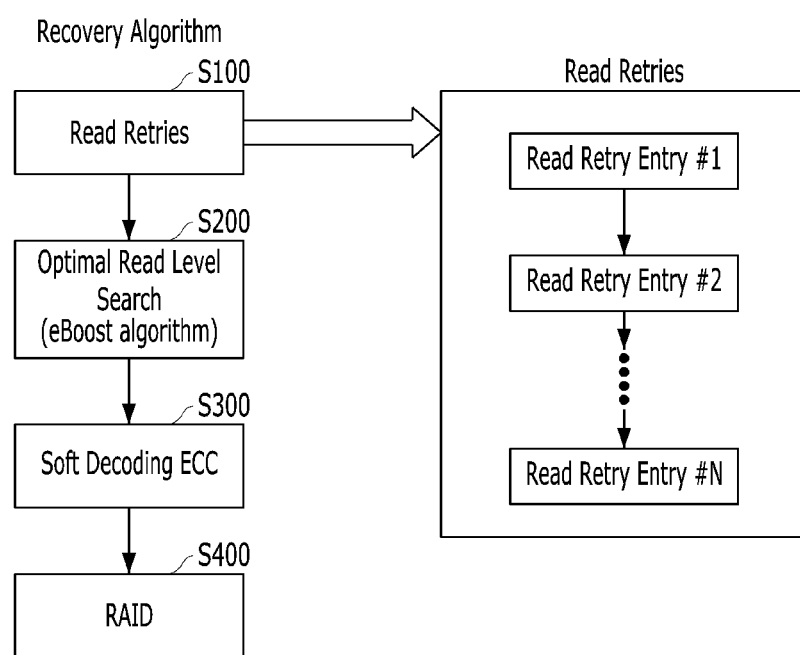
FIG. 7 is a diagram illustrating a flow of an error recovery algorithm in a memory system.

Referring to FIG. 7, the controller 120 may perform one or more read retry operations for the memory cells using one or more read threshold voltages applied in a set order (S100). For example, the read threshold voltages may include N (e.g., N is 5 or 10) read threshold voltages (or read voltage levels) including a first read threshold voltage to an Nth read threshold voltage. The first read threshold voltage may be a previously used read threshold voltage (i.e., history read threshold voltage). The historical read threshold voltage may be the read threshold voltage used in the last successful decoding, that is, a read voltage used in a read-passed read operation performed before the read retry operations. The controller 120 may perform the read retry operations until it is determined that decoding associated with a corresponding read retry operation is successful.

When all read retry operations using the read threshold voltages have failed, the controller 120 may perform additional recovery operations. For example, the additional recovery operations may include an optimal read threshold voltage search (S200), a soft decoding using an error correction code (ECC) (S300) and/or a redundant array of independent disks (RAID) recovery (S400).

As noted above, data retrieved from a memory device (e.g., a NAND flash device) in a data storage device (e.g., a solid state drive (SSD)) usually contains many bit errors due to various noise sources. To protect the data, it is encoded by an error correction code before being written to the memory device (i.e., before being written to a storage medium). A decoder may correct all bit errors by using this error correction code. As illustrated in FIG. 7 by the "Read Retries" shown there, in one embodiment of the present invention, when the number of errors surpasses the capability of the error correction code, the data storage device may invoke a particular defense algorithm (e.g., a read retry operation) to read the storage media multiple times with better parameters than the original read operation until the data can be recovered by the error correction code. As detailed below, different read thresholds can be used to better read pages of data.

Figure 8:
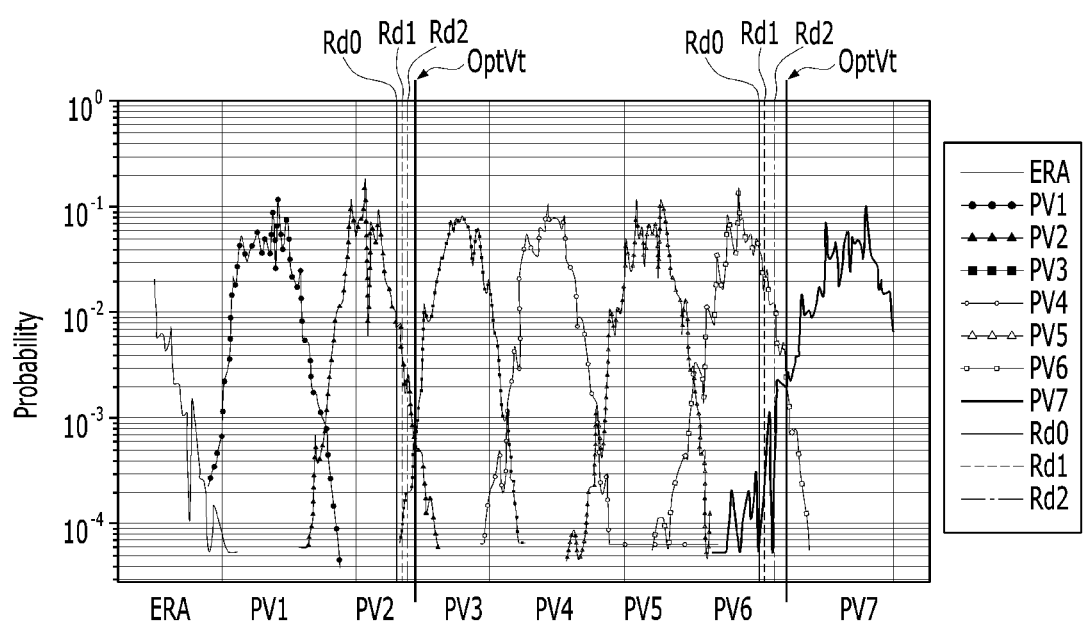
FIG. 8 is a diagram illustrating a distribution of cell levels for a particular page of a triple-level cell (TLC) flash memory device.

For a solid state drive, one source of increased bit errors is the use of sub-optimal read thresholds during the read operation as shown in FIG. 8. In FIG. 8, OptVt represents an optimal read threshold voltage and Rd0 to Rd2 represent sub-optimal read threshold voltages during the read operation for a particular page (e.g., an LSB page) of a triple-level cell (TLC) NAND flash memory device. One method (e.g., an eBoost algorithm) to estimate an optimal read threshold performs several additional read operations with different read thresholds on the same page, and estimates the optimal read threshold that minimizes the bit errors in the retrieved data. These additional read operations increase the latency of the read operation and degrades a quality of service (QoS) of the data storage device (or memory system). Accordingly, embodiments of the present invention provide a scheme to estimate an optimal read threshold without necessarily performing additional read operations.

Figure 9:
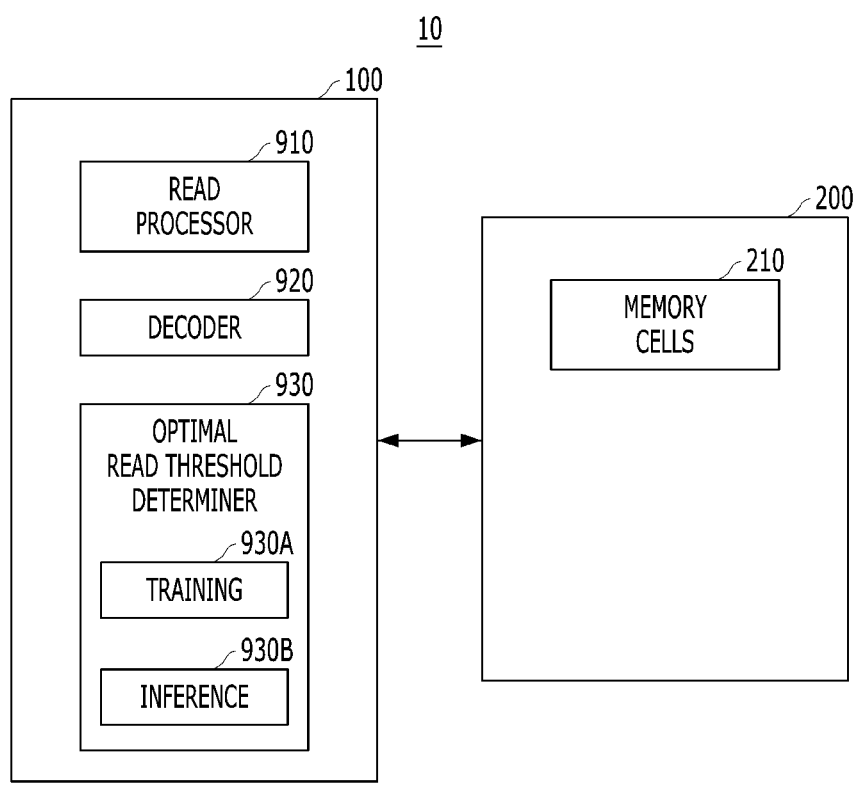
FIG. 9 is a diagram illustrating a memory system in accordance with one embodiment of the present invention.

FIG. 9 is a diagram illustrating a memory system 10 in accordance with an embodiment of the present invention.

Referring to FIG. 9, the memory system 10 may include a controller 100 and a memory device 200. The memory device 200 may include a plurality of memory cells (e.g., NAND flash memory cells) 210. The memory cells are arranged in an array of rows and columns such as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or '0') is provided at the bit line while the word line is addressed. During a read operation, the word line is again addressed, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as an SSD.

The controller 100 may include a read processor 910, a decoder 920 and an optimal read threshold determiner 930. Although it is illustrated that components of the controller 100 are implemented separately, these components may be implemented with an internal component (i.e., firmware (FW)) of the control component 120 in FIG. 2. Although not shown in FIG. 10, the controller 100 and the memory device 200 may include various other components such as those shown in FIG. 2.

The read processor 910 may control one or more read operations for the memory device 200 in response to a read request from a host (e.g., the host 5 of FIG. 1). The read processor 910 may control the read operations using various read thresholds. The decoder 920 may decode data associated with the read operations.

In various embodiments of the present invention, the read processor 910 may control a read operation for the memory cells using a select read threshold from a set read level table. In various embodiments, the read level table may include multiple read thresholds and the select read threshold may include a default read threshold. When the read operation is performed for the MSB page of TLC, the select read threshold may include a pair of first and second read thresholds [VT0, VT4] as shown in FIG. 6B. The first read threshold value VT0 is used to distinguish between an erase state (i.e., E) and a first program state (i.e., PV1), and the second read threshold value VT4 is used to distinguish between a fourth program state (i.e., PV4) and a fifth program state (i.e., PV5). When the read operation is performed for the LSB page of TLC, the select read threshold may include a pair of first and second read thresholds [VT2, VT6] such as shown in FIG. 6B. The first read threshold value VT2 is used to distinguish between a second program state (i.e., PV2) and a third program state (i.e., PV3), and the second read threshold value VT6 is used to distinguish between a sixth program state (i.e., PV6) and a seventh program state (i.e., PV7).

In one embodiment of the present invention, it is determined whether the read operation using a read threshold selected from a read threshold set succeeded or failed, depending on the decoding result of the decoder 920. When the read operation using the selected read threshold failed, the read processor 910 may control one or more read retry operations for the memory cells using read retry entries, such as shown in FIG. 7.

The optimal read threshold determiner 930 may provide a scheme of an optimal read threshold voltage (Vt) estimation (or prediction). The optimal read threshold determiner 930 may be implemented with one or more deep neural networks (DNNs). In various embodiments of the present invention, the optimal read threshold determiner 930 may include a training component 930A and an inference component 930B. The operations for the training component 930A and the inference component 930B is described below.

Figure 10:
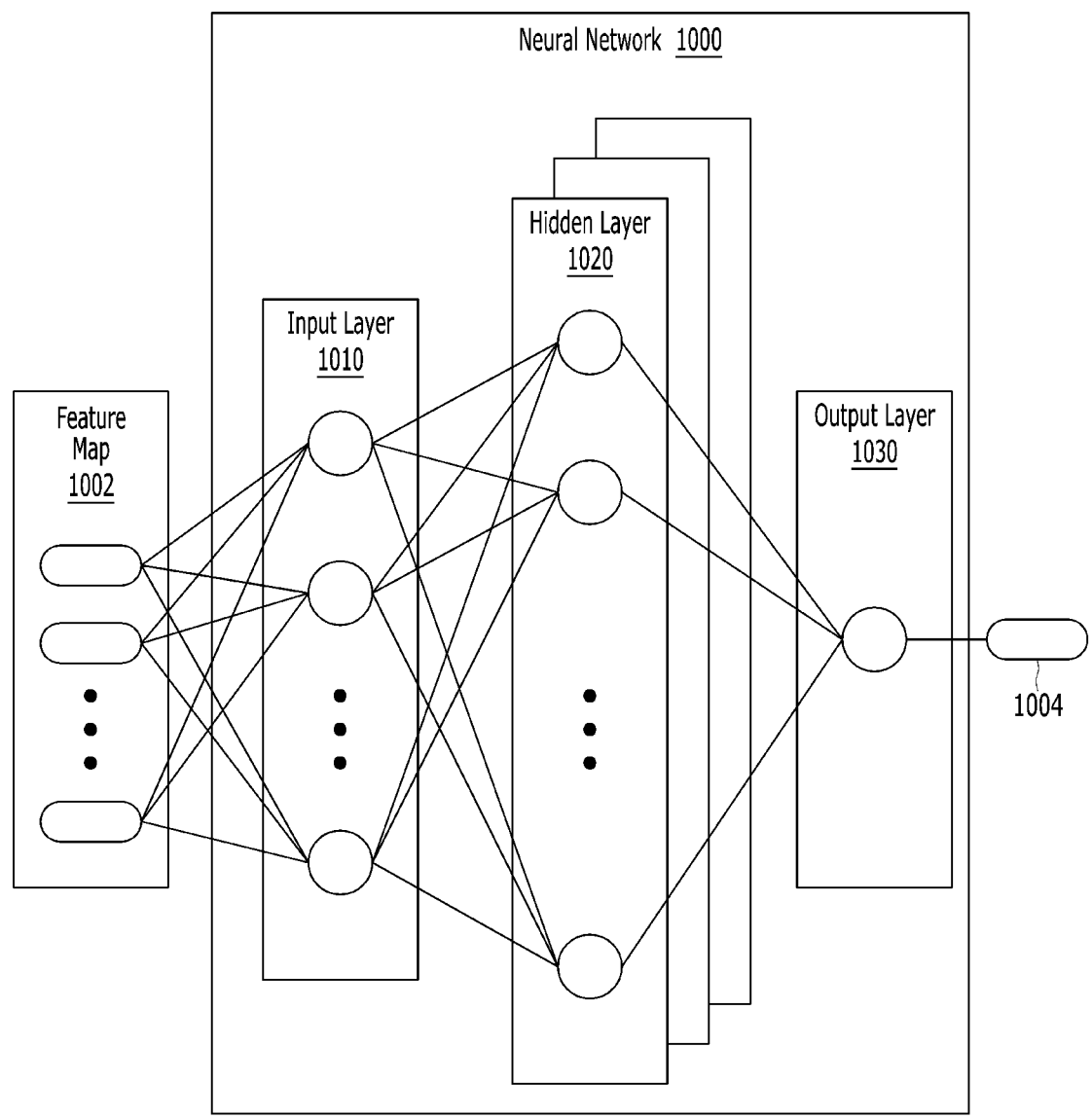
FIG. 10 is a diagram illustrating a neural network in accordance with one embodiment of the present invention.

FIG. 10 is a diagram illustrating one example of a neural network 1000 (representative of a training component) in accordance with one embodiment of the present invention. In various embodiments of the present invention, for an optimal read threshold estimation or prediction, the neural network 1000 may be included in the controller 100 of the memory system 10 in FIG. 9. That is, the neural network 1000 may be implemented for the optimal read threshold determiner 1030 in FIG. 9.

Referring to FIG. 10, a feature map 1002 associated with one or more input conditions may be input to the neural network 1000. In turn, the neural network 1000 may output information 1004. As illustrated, the neural network 1000 includes an input layer 1010, one or more hidden layers 1020 and an output layer 1030. Features from the feature map 1002 may be connected to input nodes in the input layer 1010. The information 1004 may be generated from an output node of the output layer 1030. One or more hidden layers 1020 may exist between the input layer 1010 and the output layer 1030. The neural network 1000 may be pre-trained to process the features from the feature map 1002 through the different layers 1010, 1020, and 1030 in order to output the information 1004.

The neural network 1000 may be a multi-layer neural network that represents a network of interconnected nodes, such as an artificial deep neural network, where knowledge about the nodes (e.g., information about specific features represented by the nodes) is shared across layers and knowledge specific to each layer is also retained. Each node represents a piece of information. Knowledge may be exchanged between nodes through node-to-node interconnections. Input to the neural network 1000 may activate a set of nodes. In turn, this set of nodes may activate other nodes, thereby propagating knowledge about the input. This activation process may be repeated across other nodes until nodes in the output layer 1030 are selected and activated.

As illustrated, the neural network 1000 includes a hierarchy of layers representing a hierarchy of nodes interconnected in a feed-forward way. The input layer 1010 may exist at the lowest hierarchy level. The input layer 1010 may include a set of nodes that are referred to herein as input nodes. When the feature map 1002 is input to the neural network 1000, each of the input nodes of the input layer

1010 may be connected to each feature of the feature map 1002. Each of the connections may have a weight. These weights may be one set of parameters that are derived from the learning/training of the neural network 1000. The input nodes may transform the features by applying an activation function to these features. The information derived from the transformation may be passed to the nodes at a higher level of the hierarchy.

The output layer 1030 may exist at the highest hierarchy level. The output layer 1030 may include one or more output nodes. Each output node may provide a specific value of the output information 1004. The number of output nodes may depend on the needed number of the output information 1004. In other words, in one embodiment, there is a one-to-one relationship or mapping between the number of output nodes and the number of the output information 1004.

The hidden layer(s) 1020 may exist between the input layer 1010 and the output layer 1030. The hidden layer(s) 1020 may include "N" number of hidden layers, where "N" is an integer greater than or equal to one. Each of the hidden layers 1020 may include a set of nodes that are referred to herein as hidden nodes. Example hidden layers may include up-sampling, convolutional, fully connected layers, and/or data transformation layers.

At the lowest level of the hidden layer(s) 1020, hidden nodes of that layer may be interconnected to the input nodes. At the highest level of the hidden layer(s) 1020, hidden nodes of that level may be interconnected to the output node. The input nodes may be not directly interconnected to the output node(s). If multiple hidden layers exist, the input nodes are interconnected to hidden nodes of the lowest hidden layer. In turn, these hidden nodes are interconnected to the hidden nodes of the next hidden layer. An interconnection may represent a piece of information learned about the two interconnected nodes. The interconnection may have a numeric weight that can be tuned (e.g., based on a training dataset), rendering the neural network 1000 adaptive to inputs and capable of learning.

Generally, the hidden layer(s) 1020 may allow knowledge about the input nodes of the input layer 1010 to be shared among the output nodes of the output layer 1030. To do so, a transformation $f$ may be applied to the input nodes through the hidden layer 1020. In one example, the transformation $f$ can be non-linear. Different non-linear transformations $f$ are available including, for instance, a rectifier function $f(x)=\max(0,x)$. In another example, a particular non-linear transformation $f$ can be selected based on a cross-validation. For example, given known example pairs $(x,y)$, where $x \in X$ and $y \in Y$, a function $f:X \rightarrow Y$ can be selected when such a function results in the best matches.

For example, the neural network 1000 may be a deep learning neural network used for a memory system including a NAND flash memory device. The deep leaning neural network may be created with "K" input nodes and an output node, where "K" is the number of factors (e.g., features) that define input conditions for the memory system. The output node(s) may be used to perform an activation function for a combination of input conditions. The number of layers and size of each layer in the neural network 1000 may depend on the NAND flash memory device and on an amount of the data that this memory can store.

As noted above, the neural network 1000 may be implemented for the optimal read threshold determiner 1030 in FIG. 9. In various embodiments of the present invention, the implementations of a neural network described in the following patent applications can be used: U.S. patent application Ser. No. 17/157,495, filed on Jan. 25, 2021, entitled "DEEP LEARNING BASED PROGRAM-VERIFY MODELING AND VOLTAGE ESTIMATION FOR MEMORY DEVICES;" U.S. patent application Ser. No. 17/374,750, filed on Jul. 13, 2021, entitled "SYSTEMS AND METHODS FOR NON-PARAMETRIC PV-LEVEL MODELING AND READ THRESHOLD VOLTAGE ESTIMATION;" U.S. patent application Ser. No. 17/443,755, filed on Jul. 27, 2021, entitled "SYSTEMS AND METHODS FOR MODELESS READ THRESHOLD VOLTAGE ESTIMATION;" and U.S. patent application Ser. No. 17/443,726, filed on Jul. 27, 2021, entitled "READ THRESHOLD VOLTAGE ESTIMATION SYSTEMS AND METHODS FOR PARAMETRIC PV-LEVEL MODELING," which are all incorporated by reference herein in their entirety.

Figure 11:
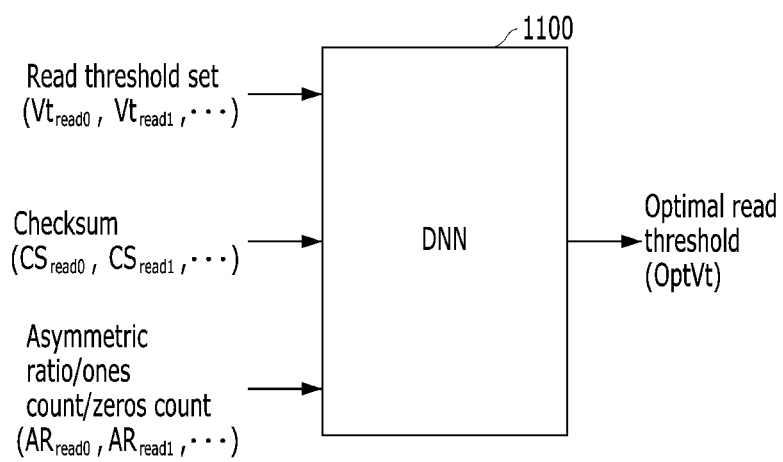
FIG. 11 is a diagram illustrating an optimal read threshold estimator in accordance with one embodiment of the present invention.

FIG. 11 is a diagram illustrating an optimal read threshold estimator 1100 (representative of an inference component) in accordance with one embodiment of the present invention. For example, the optimal read threshold estimator 1100 may correspond to the inference component 930D of the optimal read threshold determiner 930 in FIG. 9.

Referring to FIG. 11, the optimal read threshold estimator 1100 may include a deep neural network (DNN). DNN 1100 may be implemented in a system on a chip (SoC) or firmware (FW) depending on the size of the DNN used. In various embodiments of the present invention, DNN 1600 may be used for a particular page (e.g., an MSB, CSB or LSB page) of a triple-level cell (TLC) NAND flash memory device.

The optimal read threshold estimator 1100 may estimate optimal read thresholds for a failed read page based on information collected from previous read attempts of the failed read page. That is, DNN 1100 may estimate optimal read thresholds without necessarily any additional sensing operations and any intermediate parameter estimation, which are required in the implementations above mentioned.

Figure 12:
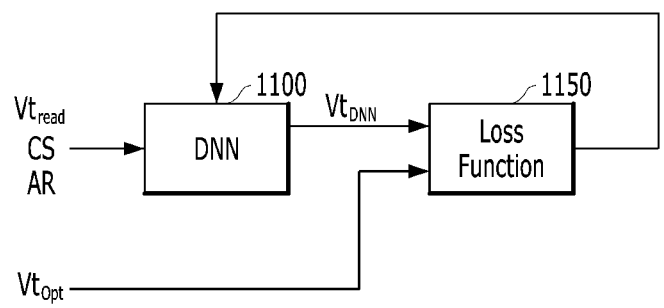
FIG. 12 is a diagram illustrating a training operation of an optimal read threshold estimator in accordance with one embodiment of the present invention.

As shown in FIGS. 11 and 12, DNN 1100 may receive information associated with previous read operations as inputs. The inputs may include a read threshold set ($Vt_{read0}$, $Vt_{read1}$, ...), checksums ($CS_{read0}$, $CS_{read1}$, ...) and an asymmetric ratio/ones counts/zeros counts set ($AR_{read0}$, $AR_{read1}$, ...). As shown in FIG. 12, DNN 1100 outputs an estimated threshold $Vt_{DNN}$ which is output to Loss Function 1150. Loss Function 1150 receives the $Vt_{Opt}$ signal and compares the estimated threshold $Vt_{DNN}$ to the $Vt_{Opt}$ signal. As shown in FIG. 12, the comparison is feedback into DNN 100, and estimates of $Vt_{DNN}$ may continue until the comparison (difference value) provided back to DNN 100 is sufficiently low.

The read threshold set Vt in FIG. 11 may include multiple values for each read of a particular page. For example, as shown in FIG. 6B, the read threshold set Vt for reading an LSB page of a TLC memory device may include two read threshold voltage values VT2 and VT6. VT2 distinguishes between the second program state PV2 and the third program state PV3. VT6 distinguishes between the sixth program state PV6 and a seventh program state PV7. For a CSB page of a TLC memory device, three read threshold voltage values (VT1, VT3, VT5) may be estimated as shown in FIG. 6B. For an MSB page of a TLC memory device, two read threshold voltage values (VT0, VT4) may be estimated as shown in FIG. 6B.

Each checksum may be an approximation for the number of bit errors, which indicates a noise level in an optimal read threshold voltage estimation. When low density parity check (LDPC) codes are used for decoding a read page as an error correction code (ECC), a syndrome weight may correspond to the number of unsatisfied check (USC) node(s) of a codeword and may be used as checksum.

Each asymmetric ratio/ones count/zeros count (i.e., an asymmetric ratio of ones count and zeros count) may be any one of the three metrics: ones count; zeros count and an asymmetric ratio of ones count and zeros count. Ones count may be the number of bit 1's in a codeword. Zeros count may be the number of bit 0's in a codeword. The asymmetric ratio AR may be defined as a ratio of the number of a first binary value to the number of a second binary value in a codeword. For example, the asymmetric ratio AR may be a value representing the number of 1's (i.e., ones count) divided by the number of 0's (i.e., zeros count) in decoded raw data. In one embodiment in which reverse logic convention is used, AR may be the number of 0's (i.e., zeros count) divided by the number of 1's (i.e., ones count). In one embodiment, a read threshold optimization system in the present invention may use any of the asymmetric ratios described in U.S. patent application Ser. No. 16/927,567, filed on Jul. 13, 2020, entitled "READ THRESHOLD OPTIMIZATION SYSTEMS AND METHODS USING DOMAIN TRANSFORMATION," the entire contents of which are incorporated herein by reference.

The DNN 1100 may be a single fully-connected network with multiple layers with a set function (e.g., a rectified linear unit (ReLu) function) as non-linearity or any other appropriate DNN structure. The DNN 1100 may estimate (i.e., predict) an optimal read threshold set OptVt based on the inputs, i.e., a read threshold set ($Vt_{read0}$, $Vt_{read1}$, ...), checksums ($CS_{read0}$, $CS_{read1}$, ...) and an asymmetric ratio/ones counts/zeros counts set ($AR_{read0}$, $AR_{read1}$, ...), as shown in FIG. 11. The predicted optimal read threshold set OptVt may be used for a next read operation and subsequent reading operations until a successful recovery of the data read from a particular NAND flash page is realized. For this estimation, the DNN 1100 may be trained as shown in FIG. 12.

DNN 1100 may be trained on a particular dataset that includes read threshold set ($Vt_{read0}$, $Vt_{read1}$, ...), checksums ($CS_{read0}$, $CS_{read1}$, ...) and an asymmetric ratio/ones counts/zeros counts set ($AR_{read0}$, $AR_{read1}$, ...) as input features and the predicted optimal read threshold voltage as the output. In some embodiments, DNN 1100 may be trained offline on measurements collected from pages of a real NAND flash memory device or a suitable channel model.

For the training of DNN 1100, a set loss function 1150 (e.g., a differentiable loss function) may be defined to measure an error between the predicted optimal read threshold voltage $Vt_{DNN}$, which is the output of DNN 1100, and the expected optimal read threshold voltage $Vt_{Opt}$ of data points in the dataset. For example, the mean square error function $(Vt_{DNN}-Vt_{Opt})^2/n$ (where n is the number of data points in a subset of training data of the dataset) may be used as the loss function 1150. The loss function 1150 may be not restricted to the mean square error function only.

The DNN 1100 may receive the result from the loss function 1150. Further, the DNN 1100 may be trained to find the predicted optimal read threshold voltage $Vt_{DNN}$ based on the result of the loss function such that the difference between the true (actual) optimal read threshold voltage $Vt_{Opt}$ and the predicted optimal read threshold voltage $Vt_{DNN}$ from DNN 1100 is minimized.

In the illustrated example of FIG. 10, the neural network 1000 (i.e., DNN 1100 of FIG. 11) may be pre-trained to process the features (i.e., read threshold, checksums and an asymmetric ratio/ones counts/zeros counts set) from the feature map 1002 through the different layers 1010, 1020, and 1030 in order to output the optimal read threshold voltage 1004. As such, DNN 1100 may be trained to refine the optimal read threshold voltage such that the difference (or error) between an actual optimal read threshold voltage $Vt_{Opt}$ and a predicted optimal read threshold voltage $Vt_{DNN}$ from DNN 1100 is minimized.

In various embodiments of the present invention, weights of DNN 1100 may be obtained. For example, a stochastic gradient descent (SGD) process, its variants and/or other algorithms may be used to obtain weights of DNN 1100 such that the loss function is minimized. The obtained weights (weight values) may be then used to process the input features (vectors) to acquire the optimal read threshold voltage. In various embodiments, input features may have read thresholds, checksums and an asymmetric ratio. For example, DNN's obtained weights may be in the form of multiple matrices $A_{DNN,0}$, $A_{DNN,1}$, ... $A_{DNN,N}$ and bias vectors $b_{DNN,0}$, $b_{DNN,1}$, ..., $b_{DNN,N}$. That is, DNN's obtained weights may include a combination of multiple matrices $A_{DNN,0}$, $A_{DNN,1}$, ..., $A_{DNN,N}$ and bias vectors $b_{DNN,0}$, $b_{DNN,1}$, ..., $b_{DNN,N}$.

DNN 1100 may receive inputs (i.e., a read threshold set, checksums and an asymmetric ratio/ones counts/zeros counts set) and estimate an optimal read threshold voltage OptVt based on the received inputs and weights. One example of estimation of the optimal read threshold set by the DNN 1100 is described below.

In one implementation, three reads are used to collect input information such as the checksum and asymmetric ratio/ones count/zeros count. As noted above, since two read threshold voltages are used for the LSB page in the TLC NAND flash memory device, these three reads correspond to six read threshold voltages. As a result, the read threshold set Vt, the checksum CS and the asymmetric ratio/ones count/zeros count AR are represented as below:

$$Vt = [Vt_{read0}^L, Vt_{read1}^L, Vt_{read2}^L, Vt_{read0}^R, Vt_{read1}^R, Vt_{read2}^R];$$

$$CS = [CS_{read0}, CS_{read1}, CS_{read2}]; \text{ and}$$

$$AR = [AR_{read0}, AR_{read1}, AR_{read2}].$$

In the equations above, $Vt_{read0}^L$ represents a first read threshold voltage (e.g., VT2 of FIG. 6B) for a zeroth read of the particular page, $Vt_{read1}^L$ represents the first read threshold voltage for a first read of the particular page and $Vt_{read2}^L$ represents the first read threshold voltage for a second read of the particular page. $Vt_{read0}^R$ represents a second read threshold voltage (e.g., VT6 of FIG. 6B) for the zeroth read of the particular page, $Vt_{read1}^R$ represents the second read threshold voltage for the first read of the particular page and $Vt_{read2}^R$ represents the second read threshold voltage for the second read of the particular page. $CS_{read0}$ represents a checksum associated with a zeroth read of the particular page, $CS_{read1}$ represents a checksum associated with a first read of the particular page and $CS_{read2}$ represents a checksum associated with a second read of the particular page. $AR_{read0}$ represents a checksum associated with a zeroth read of the particular page, $AR_{read1}$ represents a checksum associated with a first read of the particular page and $AR_{read2}$ represents a checksum associated with a second read of the particular page.

In one embodiment of the invention, the DNN 1100 shown in FIG. 12 may receive input information obtained from three reads (i.e., a read threshold set, checksums and an asymmetric ratio/ones counts/zeros counts set). Further, DNN 1100 may estimate an optimal read threshold voltage OptVt based on the received input information and weights, which are represented as below:

$$OptVt = A_{DNN,2} \times (R(A_{DNN,1} \times R(A_{DNN,0} \times [Vt,CS,AR] + b_{DNN,0}) + b_{DNN,1})) + b_{DNN,2}.$$

The equation above for three (3) previous reads may be generalized for N previous reads as below:

$$OptVt = A_{DNN,N} \times R(A_{DNN,N-1} \times R(A_{DNN,N-2} \times R(\ldots R(A_{DNN,0} \times [Vt,CS,AR] + b_{DNN,0})\ldots) + b_{DNN,N-2}) + b_{DNN,N-1}) + b_{DNN,N}.$$

In the equations above, R represents a set activation function. In various embodiments of the present invention, the set activation function may be a rectified linear unit (ReLU) activation function. Other activation functions may be applicable. As noted above, the DNN's weights may be in the form of multiple matrices $A_{DNN,0}, A_{DNN,1}, \ldots A_{DNN,N}$ and bias vectors $b_{DNN,0}, b_{DNN,1}, \ldots, b_{DNN,N}$.

Figure 13:
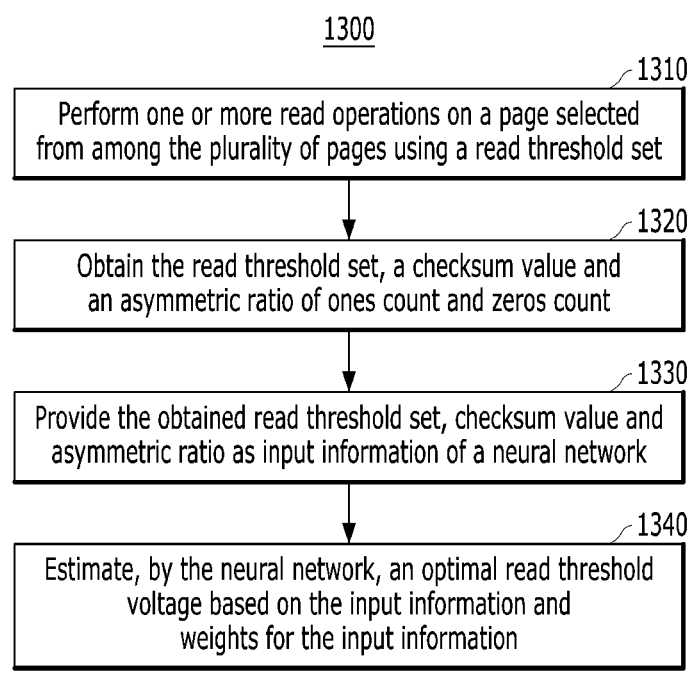
FIG. 13 is a flowchart illustrating an optimal read threshold estimation operation in accordance with one embodiment of the present invention.

FIG. 13 is a flowchart illustrating an optimal read threshold estimation operation 1300 in accordance with one embodiment of the present invention. The optimal read threshold estimation operation 1300 may be performed by the optimal read threshold determiner 930 of the controller 100 in FIG. 9, which may be implemented with the neural network (i.e., DNN) 1100 in FIG. 11.

Referring to FIG. 13, at operation 1310, the optimal read threshold determiner 930 may perform one or more read operations on a page selected from among the plurality of pages using a read threshold set including a plurality of read threshold voltages.

At operation 1320, the optimal read threshold determiner 930 may obtain the read threshold set, a checksum value and an asymmetric ratio of ones count and zeros count which are associated with decoding of the selected page according to each read operation.

At operation 1330, the optimal read threshold determiner 930 may provide the obtained read threshold set, checksum value and asymmetric ratio as input information of the neural network.

At operation 1340, the optimal read threshold determiner 930 may estimate, by the neural network 1100, an optimal read threshold voltage based on the input information and weights for the input information, the weights including a combination of multiple matrices and bias vectors.

In various embodiments of the present invention, the neural network 1100 may be trained to obtain the weights for the input information such that a set loss function is minimized. In this embodiment, the set loss function may include a differentiable loss function to measure an error between outputs of the neural network and the optimal read threshold voltage.

In other embodiments, the neural network 1100 may estimate the optimal read threshold voltage based on a combination of the input information, the multiple matrices, the bias vectors and a particular activation function. In this embodiment, the optimal read threshold voltage may be estimated based on Equation above: $OptVt = A_{DNN,N} \times R(A_{DNN,N-1} \times R(A_{DNN,N-2} \times R(\ldots R(A_{DNN,0} \times [Vt, CS, AR] + b_{DNN,0})\ldots) + b_{DNN,N-2}) + b_{DNN,N-1}) + b_{DNN,N}$, where OptVt represents the optimal read threshold voltage, Vt represents the read threshold set, CS represents the checksum values, AR represents the asymmetric ratio of ones count to zeros count, $A_{DNN,N}$ represents a (N+1)th matrix, $b_{DNN,N}$ represents a (N+1)th bias vector, and R represents the activation function. In this embodiment, the activation function can include a rectified linear unit (ReLU) activation function.

In various embodiments of the present invention, the selected page may include a least significant bit (LSB) page of a triple level cell (TLC). In this embodiment, the read threshold voltage set may include a first read threshold voltage for distinguishing an erased state and a first program state and a second read threshold voltage for distinguishing a second program state and a third program state.

As described above, embodiments of the present invention can provide a scheme for estimating an optimal read threshold voltage in a memory system (e.g., SSD). Embodiments of the present invention can estimate an optimal read threshold voltage using information obtained from previous read attempts through a neural network without any additional sensing operations and any intermediated parameter estimations. Thus, these embodiments can improve quality of service (QoS) and reliability of the memory system.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives of the disclosed embodiment. Furthermore, the disclosed embodiments may be combined to form additional embodiments.

What is claimed is:

1. A memory system comprising:
   a memory device including a plurality of pages; and
   a controller including a neural network and configured to:
   perform one or more read operations on a page selected from among the plurality of pages using a read threshold set including a plurality of read threshold voltages;
   obtain the read threshold set, a checksum value and an asymmetric ratio of ones count and zeros count which are associated with decoding of the selected page according to each of the read operations;
   provide the obtained read threshold set, the checksum value and the asymmetric ratio as input information to the neural network; and
   estimate, by the neural network, an optimal read threshold voltage based on the input information and weights for the input information, the weights including a combination of multiple matrices and bias vectors.

2. The memory system of claim 1, wherein the neural network is trained to obtain the weights such that a set loss function is minimized.

3. The memory system of claim 2, wherein the set loss function includes a differentiable loss function to measure respective errors between outputs of the neural network and the optimal read threshold voltage.

4. The memory system of claim 1, wherein the controller estimates the optimal read threshold voltage based on a combination of the input information, the multiple matrices, the bias vectors and an activation function.

5. The memory system of claim 4, wherein the controller estimates the optimal read threshold voltage based on equation:

$$OptVt = A_{DNN,N} \times R(A_{DNN,N-1} \times R(A_{DNN,N-2} \times R(\ldots R(A_{DNN,0} \times [Vt,CS,AR] + b_{DNN,0})\ldots) + b_{DNN,N-2}) + b_{DNN,N-1}) + b_{DNN,N},$$

where OptVt represents the optimal read threshold voltage, Vt represents the read threshold set, CS represents the checksum values, AR represents the asymmetric ratio of ones count and zeros count, $A_{DNN,N}$ represents a (N+1)th matrix, $b_{DNN,N}$ represents a (N+1)th bias vector, and R represents the activation function.

6. The memory system of claim 5, wherein the asymmetric ratio of ones count and zeros count includes a ratio of the ones count divided by the zeros count.

7. The memory system of claim 4, wherein the activation function includes a rectified linear unit (ReLU) activation function.

8. The memory system of claim 1, wherein the selected page includes a least significant bit (LSB) page of a triple level cell (TLC).

9. The memory system of claim 8, wherein the read threshold voltage set includes a) a first read threshold voltage for distinguishing an erased state from a first program state and b) a second read threshold voltage for distinguishing a second program state from a third program state.

10. A method for operating a memory system having a memory device including a plurality of pages and a controller including a neural network, the method comprising:
performing one or more read operations on a page selected from among the plurality of pages using a read threshold set including a plurality of read threshold voltages;
obtaining the read threshold set, a checksum value and an asymmetric ratio of ones count and zeros count which are associated with decoding of the selected page according to each of the read operations;
providing the obtained read threshold set, the checksum value and the asymmetric ratio as input information to the neural network; and
estimating, by the neural network, an optimal read threshold voltage based on the input information and weights for the input information, the weights including a combination of multiple matrices and bias vectors.

11. The method of claim 10, wherein the neural network is trained to obtain the weights such that a set loss function is minimized.

12. The method of claim 11, wherein the set loss function includes a differentiable loss function to measure respective errors between outputs of the neural network and the optimal read threshold voltage.

13. The method of claim 10, wherein the controller estimates the optimal read threshold voltage based on a combination of the input information, the multiple matrices, the bias vectors and an activation function.

14. The method of claim 13, wherein the controller estimates the optimal read threshold voltage based on equation:

$$\mathrm{Opt}Vt = A_{DNN,N} \times R(A_{DNN,N-1} \times R(A_{DNN,N-2} \times R( \ldots R(A_{DNN,0} \times [Vt, CS, AR] + b_{DNN,0}) \ldots ) + b_{DNN,N-2}) + b_{DNN,N-1}) + b_{DNN,N},$$

where OptVt represents the optimal read threshold voltage, Vt represents the read threshold set, CS represents the checksum values, AR represents the asymmetric ratio of ones count and zeros count, $A_{DNN,N}$ represents a (N+1)th matrix, $b_{DNN,N}$ represents a (N+1)th bias vector, and R represents the activation function.

15. The method of claim 14, wherein the asymmetric ratio of ones count and zeros count includes a ratio of the ones count divided by the zeros count.

16. The method of claim 13, wherein the activation function includes a rectified linear unit (ReLU) activation function.

17. The method of claim 10, wherein the selected page includes a least significant bit (LSB) page of a triple level cell (TLC).

18. The method of claim 17, wherein the read threshold voltage set includes a) a first read threshold voltage for distinguishing an erased state from a first program state and b) a second read threshold voltage for distinguishing a second program state from a third program state.

* * * * *